METHOD OF TREATING SEMICONDUCTOR DEVICES
Original Filed March 20, 1968
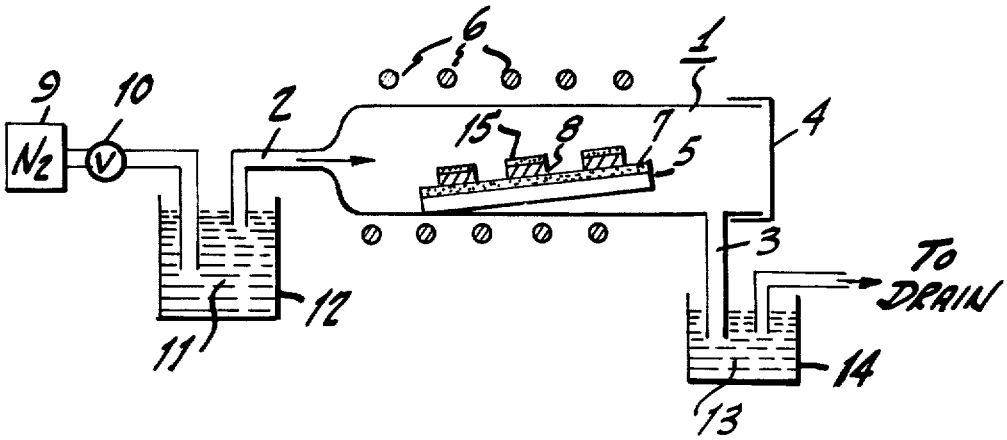
INVENTOR
ALFRED MAYER
BY
ATTORNEY

United States Patent

Re. 28,385
Reissued Apr. 8, 1975

28,385

METHOD OF TREATING SEMICONDUCTOR DEVICES

Alfred Mayer, Plainfield, N.J., assignor to RCA Corporation

Original No. 3,556,879, dated Jan. 19, 1971, Ser. No. 714,577, Mar. 20, 1968. Application for reissue Dec. 4, 1972, Ser. No. 311,774

Int. Cl. H01l 7/36

U.S. Cl. 117—201 8 Claims

Matter enclosed in heavy brackets [ ] appears in the original patent but forms no part of this reissue specification; matter printed in italics indicates the additions made by reissue.

ABSTRACT OF THE DISCLOSURE

The stability and minority carrier lifetime of a device comprising a semiconductor body covered by an insulating layer is improved by subjecting the insulating layer to an atmosphere including hydrogen chloride, while heating the device, so that a gradient is established for out-diffusion of certain deleterious metals from the device.

BACKGROUND OF THE INVENTION

This invention relates to a method for treating semiconductor devices so as to improve one or more performance parameters thereof.

In the manufacture of semiconductor devices, it is common to employ an insulating layer comprising, e.g., silicon dioxide as a protective covering on the semiconductor surface. In the fabrication of metal-oxide-semiconductor field effect devices, a thin silicon dioxide layer is employed as a dielectric to provide capacitive coupling between a selected portion of the semiconductor surface and an overlying metal (gate) control electrode.

In such applications, it is important that the insulating layer be free of contaminants which produce instabilities in device behavior.

In particular, alkali metals such as sodium, potassium and calcium which find their way into the silicon dioxide layer causes development of a residual charge or polarization which tends to produce severe instability in the operating characteristics of metal-oxide-semiconductor devices. These alkali metals, when present in a silicon dioxide layer overlying a bipolar semiconductor device, cause the formation of thin surface "inversion" layers which increase the device leakage characteristics and adversely affect other operating parameters.

Heavy metal impurities, such as gold, copper and iron act as trapping or recombination sites which seriously degrade minority carrier lifetime in the semiconductor material. This degradation of lifetime results in reduced gain and increased forward current dissipation in the device affected.

Prior art techniques for overcoming these contamination problems are directed to (i) methods for preventing the contaminants from initially entering the semiconductor device, and (ii) methods for removing the contaminants as close as possible to the termination of the device manufacturing process.

The former, or "clean handling," methods require careful cleaning of all materials and equipment, and manufacturing and assembly operation to be carried out in a dust-free laminar flow atmosphere. These methods are effective, but cumbersome to employ and expensive because of the requirements for constant vigilance, contamination measurements and personnel indoctrination.

The latter methods involve various gettering and/or out-diffusion processes. A recently developed process, e.g., involves heat treatment with a phosphorus pentoxide glass disposed on the semiconductor surface, as described in U.S. Pat. No. 3,334,281. Such a treating process, however, results in the formation of a highly doped N type surface region which usually must be subsequently removed by etching. This is a relatively cumbersome process and is not suitable for the manufacture of devices having fine-line geometries.

Other impurity removal processes heretofore known involve heat treatment in the presence of nickel or nickel alloys. These processes are believed to improve minority carrier lifetime by reducing the number of recombination centers in the semiconductor material.

An object of the present invention is to provide a process for improving the performance characteristics of semiconductor devices by removing certain deleterious metals therefrom.

SUMMARY OF THE INVENTION

The invention is applicable to a manufacturing process in which a layer of insulating material is formed on at least a part of an operating semiconductor region of an active semiconductor element. The invention relates to an improvement in which the insulating layer is exposed to an atmosphere comprising a hydrogen halide. The semiconductor device is heated in the presence of the halide at a temperature sufficient to convert a deleterious metal in the device to the metal halide. The temperature is sufficient to volatilize the halide at the exposed surface of the insulating layer, so as to establish a gradient for out-diffusion of the deleterious metal from the semiconductor device toward the exposed insulating layer surface.

IN THE DRAWING

The drawing shows apparatus useful in practicing a preferred embodiment of the process described herein.

DETAILED DESCRIPTION

The apparatus shown in the drawing comprises a generally cylindrical resistance furnace tube 1 provided with an inlet port 2 and an outlet port 3. A removable end cap 4 permits insertion and removal of the wafer boat assembly 5.

The furnace tube 1 may be heated by means of a resistance coil 6, the turns of which are heated by means of a source of electrical voltage (not shown). The boat assembly 5 has a quartz surface layer 7. Disposed on the quartz layer 7 are a number of semiconductor wafers 8 which may, e.g., comprise silicon.

Gas flow into the inlet port 2 is controlled by means of a nitrogen carrier gas source 9 and a control valve 10. The carrier gas from the source 9 passes through the control valve 10 and bubbles through a liquid solution 11 disposed in a suitable flask 12.

The liquid 11 preferably comprises an azeotropic or constant-boiling aqueous solution of hydrogen chloride, which is maintained at a temperature on the order of 110° C. For this substance, the azeotropic concentration is approximately 20.24% hydrogen chloride by weight. The resultant hydrogen chloride/water vapor/nitrogen mixture enters the furnace tube 1 through the inlet port 2. The flow rate of this mixture is controlled by adjustment of the valve 10.

In order to protect the operator from any hydrogen chloride gas which may leave the outlet port 3, the outlet port is coupled to an aqueous suspension 13 of lime which is disposed in a suitable flask 14. The lime acts a a trap to remove any hydrogen chloride from the gas stream.

It is desirable to form a silicon dioxide layer 15 on each of the semiconductor wafers 8 simultaneously with the hydrogen chloride treatment. To accomplish this, the furnace tube 1 is heated to an oxidizing temperature in the range of 800° to 1300° C. The particular temperature employed will be determined primarily by the total thickness of the silicon dioxide layer desired. Oxidation of each wafer 8 is commenced by opening the valve 10 so that the gas mixture containing hydrogen chloride and water vapor enters the inlet port 2 and passes over the exposed surface of each wafer 8.

The water vapor in the gas stream rapidly reacts with the silicon surface of each wafer 8 to thermally form the silicon dioxide layer 15 thereon. Initially, some slight etching of the silicon surface by the hydrogen chloride gas may occur, but etching will stop as soon as a thin initial silicon dioxide layer has been formed to protect the underlying silcon material.

If desired, the possibility of etching may be completely precluded by initially forming a thin silicon dioxide layer by passing oxygen or water vapor into the inlet port 2 by means of a path independent of the liquid 11. The nitrogen carrier gas 9 may then be bubbled through the liquid 11 to provide the desired hydrogen chloride/water vapor mixture at a time when each wafer 8 is protected by a thin initial silicon dioxide layer.

The oxidation process may be carried out in the manner shown in the drawing until the desired thickness of the silicon dioxide layer 15 has been grown. The treatment may be continued, after the desired thickness of silicon dioxide has been attained, by passing the hydrogen chloride/water vapor mixture over the silicon dioxide layer thereafter. Since the rate of growth of the oxide layer 15 decreases as the thickness of the oxide increases, this additional treatment will have only a small effect on oxide layer thickness.

It has been found that by applying hydrogen chloride in the manner described to a silicon dioxide layer during and/or after growth of the layer, the stability and minority carrier lifetime of the resultant device is substantially improved.

For example, a silicon wafer was divided into two portions, both of which were lightly etched in a 10% sodium hydroxide solution and rinsed in hot distilled water. One portion was exposed to water vapor in the normal manner to grow a thermal silicon dioxide layer to a thickness of approximately 0.12 microns at a temperature on the order of 1000° C. The other portion was exposed to the water vapor/hydrogen chloride atmosphere described above to grow a silicon dioxide layer of the same thickness at the same temperature. The wafer portions were annealed in a hydrogen atmosphere at elevated temperatures in the conventional manner. An aluminum layer was subsequently evaporated onto each silicon dioxide layer and capacitance-voltage measurements were made before and after exposure of each sample to a 10 volt bias (between the aluminum layer and the semiconductor layer) at 300° C. for about one minute.

Each sample was then allowed to cool and the resultant shift in the capacitance-voltage characteristic was measured. The sample which was oxidized in the normal manner showed a shift of greater than —22.5 volt, while the sample treated with hydrogen chloride according to the process described above showed a shift of less than —0.2 volt.

Other samples subjected to normal oxidation and oxidation in the presence of hydrogen chloride according to the process described above, showed a minority carrier lifetime improvement (as measured by the storage time technique) of a factor of 3 to 7 for the hydrogen chloride treated samples.

The substantial improvement realized by the hydrogen chloride treatment process according to the preferred embodiment of the invention is believed to be due to reaction of the hydrogen chloride with deleterious metals such as sodium, potassium, calcium (which causes residual charge or polarization) and gold, copper and iron (which reduces minority carrier lifetime). The hydrogen chloride reacts with these, and possibly other, metals at the exposed surface of the silicon dioxide layer to convert them into the corresponding metal chlorides.

The resulting metal chlorides, being relatively volatile at the processing temperature, leave the silicon dioxide surface. This process establishes a gradient for out-diffusion of the metallic contaminants from the semiconductor wafer through the silicon dioxide layer, and from the exposed surface of the silicon dioxide layer into the surrounding atmosphere.

This "out-diffusion" reaction, i.e. conversion of the metal contaminants to the corresponding metal chlorides and volatilization of the chlorides at the exposed surface of the silicon dioxide layer, may be carried out at temperatures in the range of 600° to 1200° C.

Since the other halides of the metal contaminants are also volatile, other hydrogen halides may be used instead of hydrogen chloride. In the case where silicon dioxide is employed as the insulating material, hydrogen bromide and hydrogen iodide may be substituted for the hydrogen chloride. Hydrogen fluoride cannot be used in this case since it etches silicon dioxide.

In addition to utilizing silicon dioxide as the insulating or dielectric material disposed on the semiconductor wafer surface, other insulating materials which may be treated in accordance with the invention are $Si_3N_4$, $Al_2O_3$, SiO, $Ta_2O_5$, $Nb_2O_5$, $HfO_2$, $ZrO_2$ and combinations thereof.

The process described herein, by removing impurity centers from the insulating layer, improves the radiation resistance of the resultant device.

In addition to silicon, other semiconductor materials such as germanium, gallium arsenide, gallium phosphide and other III–V or II–VI semiconductor materials may be protected by an insulating layer and treated with a hydrogen halide in the manner described herein to improve the operating characteristics of the resultant device.

Rather than thermally growing the silicon dioxide or other insulating layer, the insulating layer may be pyrolytically deposited from the vapor phase. In such cases it is usually desirable to densify the pyrolytically deposited material by heat treatment. Where such a pyrolytic deposition process is employed, it is preferable to employ the hydrogen halide heat treatment process described herein after the insulating layer has been deposited but before it has been densified. The reason for this procedure is that the densified layer is less permeable to out-diffusion of the metallic contaminants to be removed, so that improved processing is obtained if the contaminants are removed by diffusion through the relatively permeable undensified insulating layer.

For example, silicon nitride may be pyrolytically deposited on a silicon substrate by vapor phase reaction of silane ($SiH_4$) and ammonia ($NH_3$) at a temperature on the order of 500° to 700° C. The hydrogen chloride heat treatment described above may be carried out (in this case preferably in an atmosphere free of water vapor) at a temperature of *600°* [60°] to 800° C. After the hydrogen chloride treatment is completed, or during hydrogen chloride treatment, the silicon nitride layer may be densified by heat treatment at a temperature on the order of 900° C.

Where, according to the preferred embodiment of the invention, a silicon wafer is subjected to a mixture of stream and hydrogen chloride to simultaneously oxidize and remove deleterious metal ingredients from the semiconductor wafer, the ratio of steam flow rate to hydrogen chloride flow rate is determined by the composition of the constant boiling or azeotropic hydrogen chloride aqueous solution.

What is claimed is:

1. In a process for manufacturing a semiconductor device, comprising the steps of:

providing a substrate of a semiconductor material and forming a layer of insulating material on a given surface of said substrate, said device *including* [iocluding] at least one deleterious metal ingredient, the improvement comprising:

simultaneously with the forming of at least a portion of the insulating material layer exposing said layer to an atmosphere comprising a hydrogen halide; and heating said substrate to a temperature sufficient to *convert* [connect] said metal to the metal halide and to volatilize the halide at the exposed surface of said insulating layer, thereby establishing a gradient for out-diffusion of said metal from said device toward said exposed surface.

2. The improvement according to claim 1, wherein said layer comprises silicon dioxide and said atmosphere comprises hydrogen chloride, hydrogen bromide or hydrogen iodide.

3. The improvement according to claim 1, wherein said temperature is in the range of 600° to 1200° C.

4. The improvement according to claim 2, wherein said layer is formed by thermal oxidation of said semiconductor material.

5. The improvement according to claim 2, wherein at least a part of said oxidation is carried out by passing an atmosphere comprising steam and hydrogen chloride over said given surface.

6. A process for manufacturing a semiconductor device comprising the steps of:

providing a substrate of a semiconductor material;

pyrolytically depositing a non-densified layer of an insulating material on a surface of said substrate said device including at least one deleterious metal ingredient;

exposing said layer to an atmosphere comprising a hydrogen halide and heating said substrate to a temperature sufficient to convert said metal to the metal halide and to volatilize the halide at the exposed surface of said insulating layer, thereby establishing a gradient for out-diffusion of said metal from said device toward said exposed surface; and then densifying said layer by heat treatment at a specific temperature.

*7. In a method of thermally growing a silicon dioxide layer on the surface of a silicon material comprising the step of:*

*heating the silicon material to a temperature of between about 600° C. and 1200° C. in the presence of an oxidizing atmosphere;*

*the improvement comprising the step of:*

*introducing into the oxidizing atmosphere a gaseous halogen substance selected from the group consisting of hydrogen chloride, hydrogen bromide, and hydrogen iodide to neutralize the electrical effects of mobile ions in the silicon dioxide layer.*

*8. A method as defined in claim 7 in which the gaseous halogen substance is hydrogen chloride.*

References Cited

The following references, cited by the Examiner, are of record in the patented file of this patent or the original patent.

UNITED STATES PATENTS

| | | | |
|---|---|---|---|
| 2,953,486 | 9/1960 | Atalla | 148—191 |
| 3,007,820 | 11/1961 | McNamara et al. | 148—191 |
| 3,085,033 | 4/1963 | Handelman | 148—191 |
| 3,162,557 | 12/1964 | Brock et al. | 148—191 |
| 3,183,128 | 5/1965 | Leistiko, Jr. et al. | 148—191 |
| 3,243,323 | 3/1966 | Corrigan et al. | 148—188 UX |
| 3,373,051 | 3/1968 | Chu et al. | 148—1.5 UX |
| 3,518,134 | 6/1970 | Preist | 148—1.5 X |
| 3,562,033 | 2/1971 | Jansen et al. | 148—189 |

CHARLES E. VAN HORN, Primary Examiner

B. J. LEWRIS, Assistant Examiner

U.S. Cl. X.R.

29—571; 117—106 R; 148—187